United States Patent [19]

Schmidt

[11] Patent Number: 5,072,221
[45] Date of Patent: Dec. 10, 1991

[54] ERROR LIMITING ANALOG TO DIGITAL CONVERTER

[75] Inventor: Robert R. Schmidt, Colorado Springs, Colo.

[73] Assignee: Signal Processing Technologies, Inc., Colorado Springs, Colo.

[21] Appl. No.: 228,638

[22] Filed: Aug. 4, 1988

[51] Int. Cl.[5] ............................................. H03M 1/36
[52] U.S. Cl. .................................................. 341/159
[58] Field of Search ................ 341/159, 155, 118, 158, 341/160, 98; 371/43

[56] References Cited

U.S. PATENT DOCUMENTS

| | | | |
|---|---|---|---|
| 3,221,324 | 11/1965 | Margopoulos | 341/159 X |
| 3,425,054 | 1/1969 | Cowan | 341/159 |
| 3,537,101 | 10/1970 | Campanella et al. | 341/159 |
| 3,877,025 | 4/1975 | Maio | 341/159 |
| 4,644,322 | 2/1987 | Fujita | 341/159 |
| 4,739,306 | 4/1988 | Tung | 341/136 |
| 4,884,075 | 11/1989 | Mangelsdorf | 341/155 X |

FOREIGN PATENT DOCUMENTS 0249538 12/1987 European Pat. Off. ............ 341/159

OTHER PUBLICATIONS

"The Behavior of Flip-Flops Used as Synchronizers and Prediction of Their Failure Rate," H. Veendrick, *IEEE Journal of Solid-State Circuits*, vol. SC-15, No. 2, Apr. 1980.

"Prediction of Error Probabilities for Integrated Digital Synchronizers, " J. Hohl, W. Larsen, L. Schooley *IEEE Journal of Solid-State Circuits*, vol. SC-19, No. 2, Apr. 1984.

"A 6-Bit/200-MHz Full Nyquist A/D Converter," B. Zojer, R. Petschacher, W. Luschnig, *IEEE Journal of Solid-State Circuits*, vol. SC-20, No. 3, Jun. 1985.

Primary Examiner—Pellinen A. D.
Assistant Examiner—Sharon D. Logan
Attorney, Agent, or Firm—Sheridan, Ross & McIntosh

[57] ABSTRACT

A parallel analog-to-digital converter having comparators in a sequence with two sets of logic gates having inputs electrically connected to selected primary and complementary outputs of the comparators.

3 Claims, 3 Drawing Sheets

ERROR LIMITING ANALOG TO DIGITAL CONVERTER

BACKGROUND OF THE INVENTION

The present invention relates to parallel analog-to-digital converters and, more particularly, to a technique for reducing or eliminating output errors caused by ambiguities occurring in outputs of comparators and decoding circuitry logic gates used in the converters.

Analog-to-digital converters of many kinds are increasingly being used in more kinds of situations and equipment. This increase in use has occurred because the cost of integrated circuits has decreased while the rate and accuracy performance thereof has increased. This increase in capability has brought even greater demand for better performance, including ever faster operating analog-to-digital converters In analog-to-digital converters, increases in conversion rate often come at the expense of converter accuracy. In general, the parallel, or flash, analog-to-digital converter is the design currently permitting the fastest conversion rate. The ability of the parallel analog-to-digital converter to perform fast conversion arises through its ability to sample any analog input signal in the converter's input signal range in one short clock cycle. Conversion rates are further increased by minimizing the number of circuit components along the signal paths to the converter's output taken by the converter internal signals during the conversion of an analog sample value into its digital equivalent.

One way to minimize the number of circuit components in a flash converter decoding circuit is through use of decoding circuitry implementing the so called "thermometer code". Implementation of the thermometer code requires providing a first level of logic gates connected to the comparator outputs with these gates providing a sequence of outputs. Each gate output corresponds to one comparators in a sequence of comparators each of which has a higher reference voltage on its reference input than the preceding one. The thermometer code corresponds to providing a logic state on an output of one of the logic gates that differs from the logic states provided on all other gate outputs, this selected gate being the gate corresponding to the last comparator in the sequence of comparators having its reference level exceeded by the system analog input voltage signal provided commonly on the signal inputs of the comparator.

This arrangement can be seen in the analog-to-digital converter 10 of FIG. 1 showing an arbitrarily chosen number of comparators, 50, 80, 110, 140, 170, 200, and 230, in a sequence. The reference voltage inputs of these comparators are the inputs, 54, 84, 114, 144, 174, 204, and 234, respectively, each of which is connected to a monotonically increasing sequence of voltage reference values. These values are established by a reference voltage source applied between a pair of voltage source terminals, 12 and 14, and a voltage divider network also between these terminals formed by series-connected set of resistors, 52, 82, 112, 142, 172, 202, 232 and 262. Each of the non-inverting comparator inputs 56, 86, 116, 146, 176, 206, and 236, is connected to the system analog voltage signal input, 16. Each comparator has a primary output, 24, on the upper diagonal side thereof and a complementary output, 22, on its lower diagonal side. Each comparator has a clock input (not shown) on which it receives periodic clock pulses corresponding to the desired sampling rate. The outputs of each of the comparators are held at the value occurring at the beginning of a clock pulse for the remainder of the clock pulse.

If the input voltage on the non-inverting input 20 of a comparator is sufficiently less than the reference voltage on the inverting input 18 of the comparator, the comparator's primary output has a low logic state voltage level thereon and its complementary output 22 has a high logic state voltage level thereon. If, on the other hand, the input voltage exceeds the reference voltage by a sufficient amount, the primary output 24 has a high logic state voltage level thereon and the complementary output 22 has a low logic state voltage level thereon.

From the outputs of the comparators, following the rules of operation therefor described above, the thermometer code can be implemented using a sequence of two input AND logic gates 60, 90, 120, 150, 180, and 210, with one corresponding to each comparator, that provide a first level of logic gates. Each AND gate in FIG. 1 has one input thereof, 26, connected to primary output 24 of one comparator in the sequence thereof, and another input, 28, connected to complementary output 22 of the next succeeding comparator in that sequence. As is well known, the output of an AND logic gate will be at a high logic voltage level only if all of its inputs are also at a high logic voltage level. For the first level of AND gates connected as in FIG. 1, this occurs if both the primary output of the comparator to which it is connected and the complementary output of the next succeeding comparator to which it is also connected both provide high logic voltage levels.

In operation, this results in only one of the AND logic gate outputs 30 providing a high logic state voltage level, and each of the remaining AND logic gate outputs 30 providing a low logic state voltage level. This one gate will be the one that corresponds to the comparator in the sequence thereof having the largest reference voltage connected thereto that is sufficiently less in voltage level than the system input analog signal voltage.

The outputs 30 of the AND logic gates are shown in FIG. 1 connected to a binary decoder comprising a set of OR logic gates, 236, 240 and 244, which form a second level of logic gates. Again, as is well known for an OR gate, the occurrence of a high logic state voltage level on any of the inputs of an OR logic gate will place the output thereof in the same high logic state voltage level. These OR logic gates 236, 240, 244 have outputs 238, 242, and 246, respectively, on each of which there is provided a logic state signal forming a digit signal indicating the value of a digit for the binary number representation provided when all of the digit signals on outputs 238, 242 and 246 are considered together. The binary number represented by a particular set of logic values occurring in the digit signals will have a value corresponding to the amplitude of the voltage signal occurring on the system analog voltage signal input 16 and giving rise to the binary representation.

The output 30 of each first logic level AND gate 60, 90, 120, 150, 180, or 210 is connected to an input of selected ones of the second logic level OR gates 236, 240, or 244. These are just those gates state on output 222 thereof when the comparator corresponding to the AND gate connected thereto has a reference voltage on its inverting input 18 less than the voltage on its non-inverting input 24 from voltage applied to the system analog voltage signal input 16.

One type of error which may occur in the parallel analog-to-digital converter of FIG. 1 occurs when the input voltage signal applied to system analog voltage signal input 16 to the non-inverting input 20 of each comparator, is very nearly equal to the reference voltage applied to one of the non-inverting inputs 18 of one of the comparators. If this occurs with a sufficiently small difference between these two voltage levels, the logic levels on the primary and complementary outputs 22 and 24, respectively, of that comparator are undefined, i.e. they may be anywhere between the low and high logic state voltage levels and thus provide an ambiguous or indefinite logic voltage level. Such result is likely to further result in erroneous logic voltage levels being present on outputs 238, 242 and 246 of each of OR gates 236, 240 and 244, respectively.

Thus, there is desired a parallel analog-to-digital converter that avoids such output errors, or at least limits the extent thereof, if an indefinite voltage level occurs on a comparator output 238, 242 or 244, but without sacrificing the sample conversion rate of the converter.

SUMMARY OF THE INVENTION

The present invention provides a parallel analog-to-digital converter having comparators in a sequence with two sets of logic gates electrically connected to selected primary and complementary outputs of the comparators. The first set of logic gates each have an input connected to a primary output of a comparator and another input connected to the complementary output of an adjacent comparator in the sequence thereof. The second set of logic gates each have an input connected to a primary output of a comparator and another input connected to the complementary output of the next comparator after an adjacent comparator in the sequence thereof. The outputs of these two sets of logic gates are electrically connected to a selected decoding arrangement.

BRIEF DESCRIPTION OF THE DRAWINGS

FIG. 4 shows a circuit schematic diagram of a two input AND logic gate used in the present invention; and FIG. 5 shows a circuit schematic diagram of a three input OR logic gate used in the present invention.

DETAILED DESCRIPTION OF THE PREFERRED EMBODIMENTS

Figure 1:
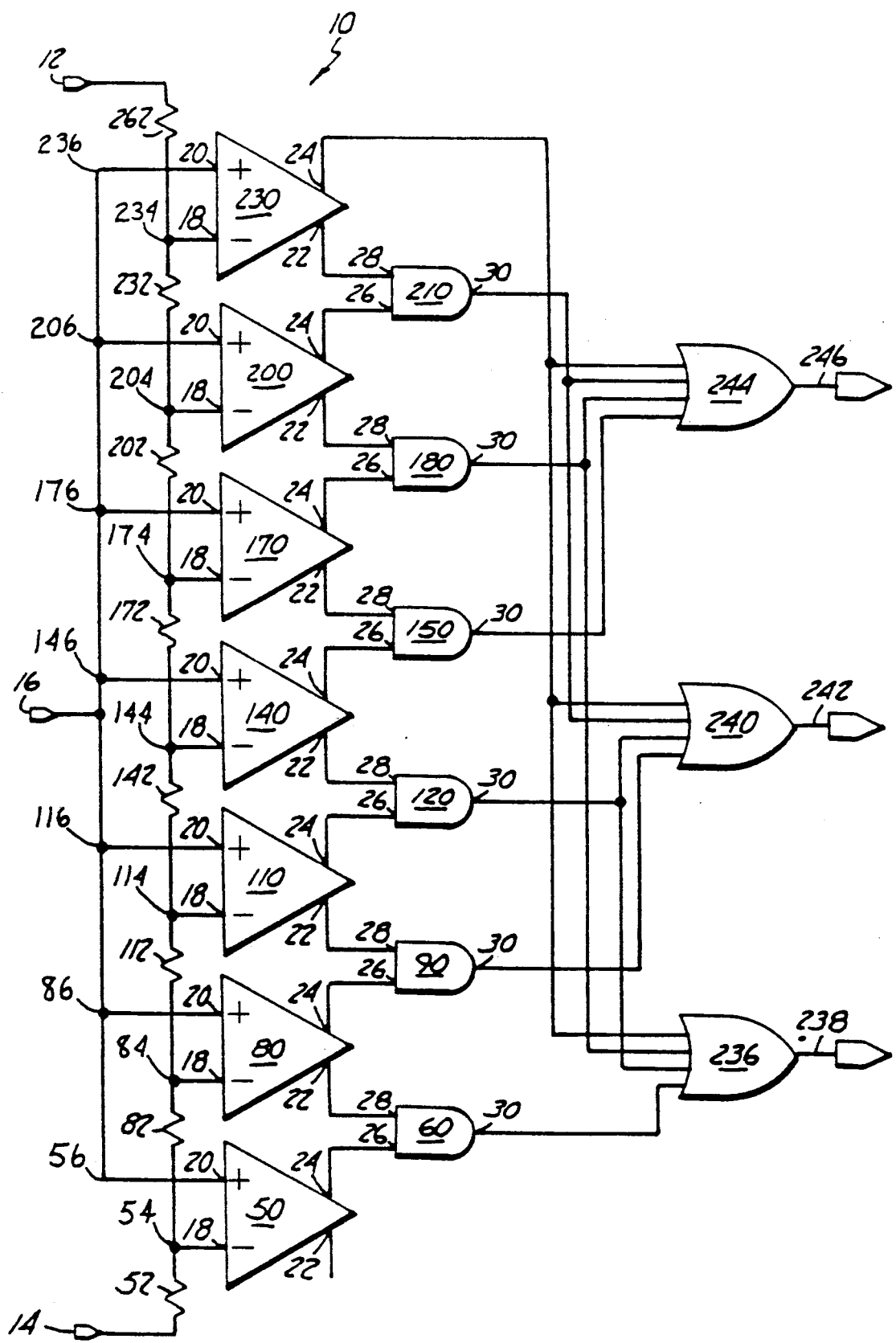
FIG. 1 shows a logic diagram of a parallel analog-to-digital converter using a first level of AND logic gates followed by a first level of OR gates forming a binary decoder subject to erroneous outputs for some system inputs.
Figure 2:
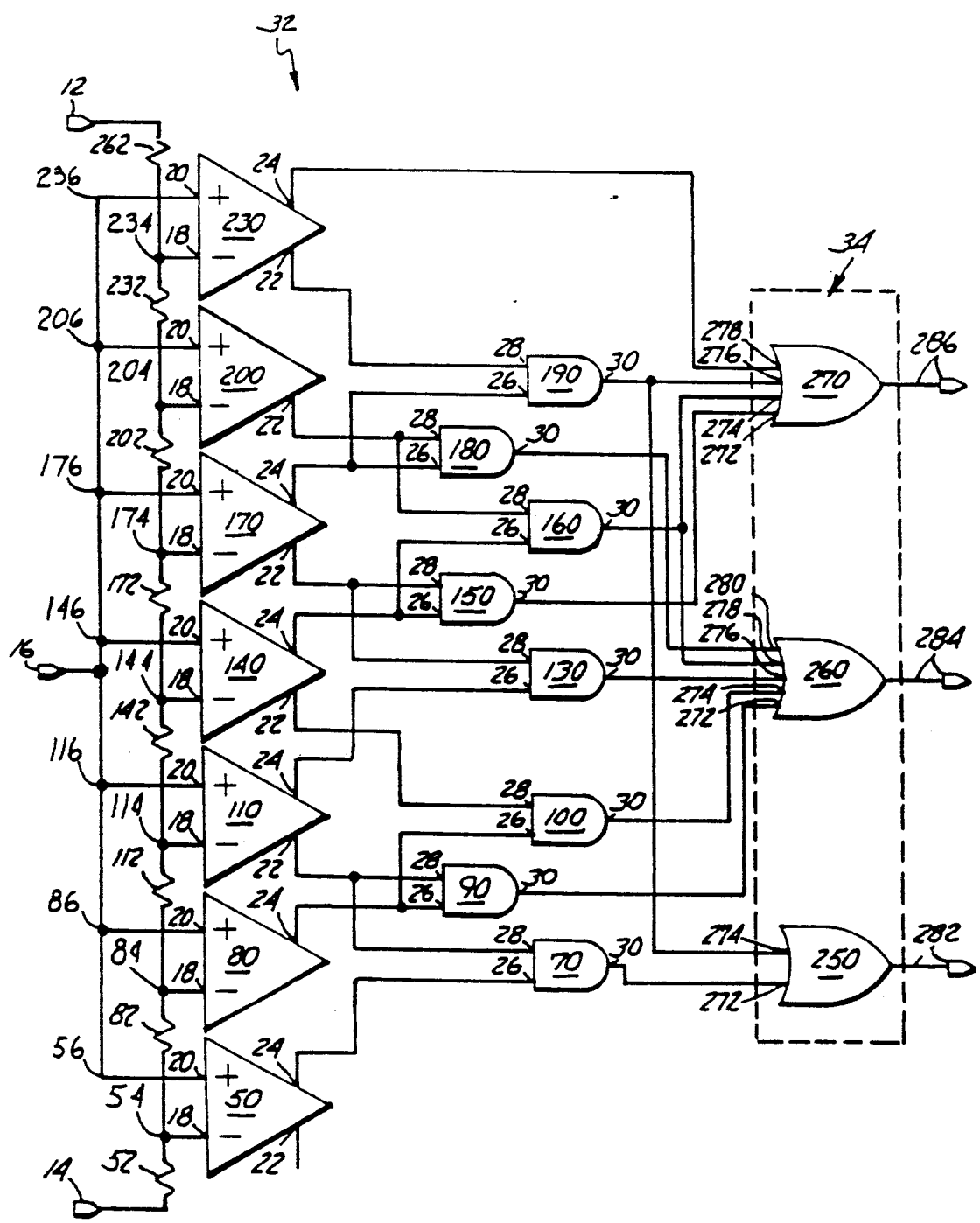
FIG. 2 shows a logic diagram of the parallel analog-to-digital converter system of FIG. 1 with a second level of AND gates added with a decoder now provided to implement a Gray code from signal inputs thereto following the thermometer code.

FIG. 2 shows a dual thermometer code, parallel analog-to-digital converter system, 32, comprising the parallel analog-to-digital converter 10 of FIG. 1 with a second level of AND logic gates, 70, 100, 130, 160 and 190, and an alternative decoder 34 to implement a Gray code rather than a normal binary code from the signal inputs following the thermometer codes. The decoder 34 comprises a set of OR logic gates, 250, 260 and 270, each having a varying number of inputs 272-280 and a single output 282, 284 and 286. The previously used AND logic gates 60, 90, 120, 150, 180 and 210 implement a first thermometer code. The added AND logic gates 70, 100, 130, 160 and 190 implement a second thermometer code. These latter AND logic gates each have a pair of inputs, 26 and 28, and a single output 30.

Each input 26 of AND logic gates 70, 100, 130, 160 and 190 is connected to a primary output 24 of a corresponding one of comparators 50, 80, 110, 140, 170, 200 and 230. Each input 28 of these gates is connected to complementary output 22 of the second succeeding comparator up the sequence thereof. Outputs 282, 284, and 286 OR logic gates 250, 260 and 270 provide logic states thereon reflecting a Gray code representation corresponding to the amplitude value of the voltage applied to the system analog voltage signal input 16. Inputs 272-280 of OR logic gates 250, 260 and 270 are connected to outputs 30 of both first set AND logic gates, 90, 150, 180 and second set AND logic gates 70, 100, 130, 160 and 190, and to primary output 24 of comparator 230, such that the following Gray code appears on outputs 282, 284 and 286:

TABLE I

| Highest Sequential Comparator with its Primary Output 24 Providing a High Logic Voltage Level | Outputs from OR Gate 250, 260, and 270 Number: | | |
|---|---|---|---|
| | 286 | 284 | 282 |
| none | 0 | 0 | 0 |
| 50 | 0 | 0 | 1 |
| 80 | 0 | 1 | 1 |
| 110 | 0 | 1 | 0 |
| 140 | 1 | 1 | 0 |
| 170 | 1 | 1 | 1 |
| 200 | 1 | 0 | 1 |
| 230 | 1 | 0 | 0 |

This code is implemented by connecting the inputs 272-284 of OR gates 250, 260 and 270 to the outputs 30 of the first set of AND gates 90, 120, 150 and 180, the second set of AND gates 70, 100, 130, 160 and 190, and primary output 24 of comparator 230 that provide a high logic voltage level only from that single Gray code representation for which each respective output 282, 284 and 286 of OR gates 250, 260 and 270 that also provide a high logic voltage level.

Figure 3:
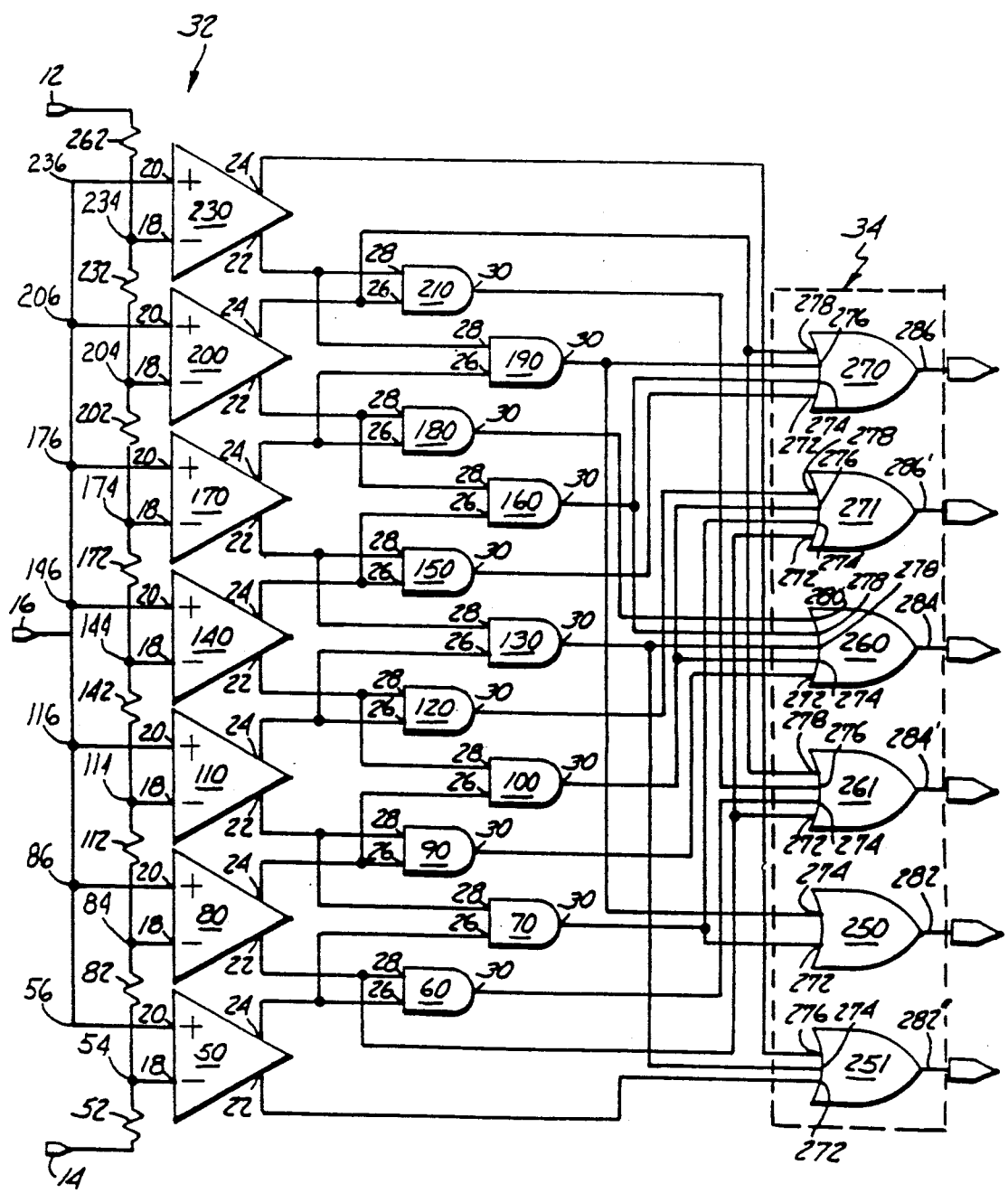
FIG. 3 shows a logic diagram of the parallel analog-to-digital converter system of FIG. 2 having additional complementary Gray code outputs.

Referring now to FIG. 3, the dual thermometer code parallel analog-to-digital converter system 32 of FIG. 2 is shown, however, the decoder 34 in FIG. 3 includes additional OR gates, 251, 261 and 271, each having two to five inputs 272-280 and outputs 282', 284 and 286. Also, AND logic gates 60, 120, 210 are included and connected to comparators 50-230 in the same manner as AND gates 90, 150, 180. OR gate 251 is connected to provide the complementary logic state voltage level of OR gate 250. OR gate 261 is connected to provide the complementary logic state voltage level of OR gate 260. OR gate 271 is connected to provide the complementary logic state voltage level of OR gate 270.

FIG. 4 shows a schematic diagram of a two input AND logic gate, 300, used for both first set AND logic gates 60, 90, 120, 150, 180 and 210 and second set AND logic gates 70, 100, 130, 160 and 190. AND logic gate 300 comprises a first bipolar NPN transistor, 302, a second bipolar NPN transistor, 304, and a resistor, 306. First bipolar NPN transistor 302 and second bipolar NPN transistor 306 each have a base, 308, an emitter 310, and a collector, 312.

First unipolar NPN transistor 302 and second bipolar NPN transistor 304 base connections 308 each are electrically connected to a terminal means, 314, adapted for connection to a voltage source. First bipolar NPN transistor 302 and second bipolar NPN transistor 304 each has its collector 312 connected to a circuit output terminal means, 30. First bipolar NPN transistor 302 emitter connection 310 is connected to one circuit input terminal means, 28, and second bipolar NPN transistor 304 emitter 310 is connected to another circuit input terminal means, 26. Voltage source terminal 314 is electrically connected to output terminal 30 through resistor 306.

FIG. 5 shows a three input OR logic gate, 322, as used in decoder 34 comprising a first bipolar NPN transistor, 324, a second bipolar NPN transistor, 326, and a third bipolar NPN transistor, 328. Each has a base 330, an emitter 332 and a collector 334. Emitters 332 are each electrically connected to a circuit output terminal means, 282, and collectors 334 are each connected to a terminal means, 338, adapted for connection to a voltage source. Bases 330 are each electrically connected to one of the circuit input terminals, 272, 274 and 276.

In operation, the circuits of FIG. 2 and FIG. 3 provide similar output signals at the outputs of first set logic gate, 60, 90, 120, 150, 180 and 210 as are provided at the outputs of the AND gates of FIG. 1 for similar system input signals. Outputs 30 of second set AND logic gates 70, 100, 130, 160 and 190 are each at a high logic state voltage level if primary output 24 of one of comparators 50, 80, 110, 140, or 170 is at a high logic state voltage level, and complementary output 22 of the second following comparator up the sequence thereof, comparators 110, 140, 170, 200 or 230, respectively, is also at a high logic state voltage level. A second thermometer code is thus provided at outputs 30 of AND logic gates 70, 100, 130, 160 and 190.

Outputs 282, 284 and 286 of OR logic gates 250, 260 and 270 will have thereon logic state voltage levels corresponding to the Gray code shown in Table 1. In this, as in any other Gray code, only a single output 282, 284 or 286 of OR logic gates 250, 260 and 270 changes logic states between adjacent output states for a change in the voltage value occurrence at system analog voltage signal input 16 that changes just enough to cause such an output state change. This choice of code has the advantage of reducing the magnitude of an error in digital Gray code representation on the logic voltage level outputs 282, 284 or 286 to the magnitude of the step between discrete Gray code digit representations because a change in a single output corresponds to a change to the next or the previous sequential Gray code representation.

The additional OR logic gates 251, 261 and 271 shown in FIG. 3 over those shown in FIG. 2 are connected to provide complementary Gray code outputs. For example, if OR logic gate 250 output 282 is at a high logic state voltage level, output 282' of OR logic gate 251 will be at a low logic state voltage level. Similarly, if output 282 of OR logic state gate 250 is at a low logic voltage level, output 282' of OR logic gate 251 will be at a high logic state voltage level. This output is obtained by connecting OR gates 251, 261 and 271 only to those AND gate outputs 30 and comparator outputs 22 and 24 that provide a high logic state voltage level only for analog inputs on system analog voltage signal input 16 that have a corresponding complementary Gray code representation requiring a high logic state voltage level on outputs 282', 284' and 286'.

In the same manner, OR logic gate 261 output 284' provides a logic state that is a complement to that occurrence on output 284 of OR logic gate 260, and output 286' of OR logic gate 271 provides a logic state that is the complement of that occurring on output 286 of OR logic gate 270. The addition of OR logic gates 251, 261 and 271 in FIG. 3 allows the output signals of decoder 34 to be detected by measuring the output logic state voltage level determined by measuring the difference between an output voltage level on output 282, 284 or 286 of OR logic gates to 250, 260 and 270 and the output voltage level on output 282', 284', 286' of corresponding one of OR logic gates 251, 261 and 271.

When the analog voltage at system analog voltage signal input 16 is at a voltage level very nearly equal to one of the reference voltages at one of the inverting inputs 18 of comparators 50, 80, 110, 140, 170, 200 or 230, the output voltage on that comparator's complementary output 22 and primary output 24 may be forced to some intermediate voltage level between a low logic state voltage level and a high logic state voltage level. Such a comparator may thus provide output voltage levels on outputs 22 and 24 thereof which do not denote clearly either a high or a low logic state. This intermediate voltage is applied to input 26 of one and to input 28 of an adjacent one of AND gates 60, 90, 120, 150, 180 and 210. Similarly, this intermediate voltage will also be applied to adjacent ones of AND gates 70, 100, 130, 160 and 190, the application thereof to input 26 of one and input 28 of the other. As a result, the outputs 30 of such AND gates will also be at an intermediate voltage level between the low and high logic states.

If such an intermediate voltage level is applied to one of the inputs of OR gates 250, 251, 260, 261, 270 or 271, the corresponding transistor in FIG. 5, being connected as an emitter follower, will tend to cause to appear on the output of that OR gate again an intermediate logic voltage level. In operation, the actual voltage level at output 282, 282', 284, 284', 286 or 286' of that gate will be about equal to the largest voltage level applied to any of its inputs.

However, an intermediate voltage level from comparators 50, 80, 110, 140, 170, 200 or 230, propagating, as above, through the AND gates to the OR gates, results in at most one of the outputs 282, 284 or 286 of OR gates 250, 260 or 270, having thereon an intermediate voltage level. This result arises because both the first thermometer code outputs from AND gates 60, 90, 120, 150, 180, and 210 and the second thermometer code outputs from AND gates 70, 100, 130, 160, and 190 are used such that the OR gates use alternate comparators as well as adjacent comparators in generating the Gray code of Table I.

When OR gates 251, 261 and 271 are included (FIG. 3), their outputs 282', 284', and 286' will provide the complementary logic voltage level of OR gates 250, 260 and 270 outputs 282, 284 and 286, respectively.

When a comparator 50, 80, 110, 140, 170, 200 or 230 provides intermediate logic voltage levels on its outputs 22 and 24, and output 282, 284 or 286 of one of the OR gates 250, 260 or 270 also asserts an ambiguous logic voltage level (as described above), the output 282', 284' or 286' of the OR logic gate 251, 261, or 271 that provides the complementary logic voltage signal of the one OR gate 250, 260, or 270 asserting the ambiguous logic voltage level will itself also assert an ambiguous logic voltage level on its output 282', 284' or 286'. By measuring the difference between the output voltage levels on these two OR gate outputs, the full logic voltage level range will be restored because the two voltage levels are approximately equal and thus eliminate the ambiguous logic voltage level. Increased clock rates may be used because a following logic stage may be of a type which requires a decreased operation rate when receiving the lower input drive voltage levels associated with an ambiguous logic voltage level.

In FIG. 4, the output 30 of the two input AND gate 300 will be pulled to a low logic voltage level when current is drawn through first bipolar NPN transistor 302 or second bipolar NPN transistor 304 when either input 26 or input 28 is at a low logic voltage level and the voltage level at output 30 is equal to the voltage level at the voltage source connection 314 minus the voltage drop through resistor 306. Output 30 is pulled high by the voltage applied to voltage source connection 314 through resistor 306 only when both input 26 and input 28 are both at a high logic level voltage because the junction between the base connection 308 and the emitter connection 310 in the first bipolar NPN transistor 302 and in the second bipolar NPN transistor 304 is reversed biased, and transistors 302 and 304 are off.

In FIG. 5, the output 282 of OR gate 322 will generally follow the ,highest voltage level applied to inputs 272, 274 or 276 in this emitter-following configuration.

Although the present invention has been described with reference to preferred embodiments, workers skilled in the art will recognize that changes may be made in form and detail without departing from the spirit and scope of the invention.

What is claimed is:

1. A signal amplitude indicator system having a system input at which a signal can be provided to permit providing an indication of the signal's amplitude, said system comprising:
   a plurality of comparators, each having a primary output and a complementary output, and each having a reference input and a signal input with each said comparator having said signal input electrically connected to said system input, and with each of said plurality of comparators providing a first set of logic values at said primary and complementary outputs if signal values occurring on said signal input sufficiently exceed a reference value present on said reference input, providing a second and opposite set of logic values at said primary and complementary outputs if signal values occurring on said signal input are less than said reference value and providing an indefinite set of logic values at said primary and complementary outputs if signal values occurring on said signal input are substantially equal to said reference value, said plurality of comparators being ordered sequentially and each successive comparator having said reference input electrically connected to one of a plurality of corresponding reference sources that each provide a reference value and are ordered by a monotonic succession of the reference values provided by each of the reference sources;
   a first plurality of logic gates, each of said first plurality of logic gates having first and second inputs and an output, wherein said first input of each of said first plurality of logic gates being electrically connected to said primary output of a comparator of said plurality of comparators, and said second input of each of said first plurality of logic gates being electrically connected to said complementary output of an adjacent comparator to said comparator of said plurality of said comparators in said sequence of comparators and to which said first input is electrically connected, said outputs of said first plurality of logic gates having a first code;
   a second plurality of logic gates, each of said second plurality of logic gates having first and second inputs and an output, wherein said first input of each of said second plurality of logic gates being electrically connected to said primary output of a comparator of said plurality of comparators, and said second input of each of said second plurality of logic gates being electrically connected to said complementary output of a comparator of said plurality of comparators that is separated from said comparator of said plurality of comparators in said sequence of comparators and to which said first input is electrically connected, said outputs of said second plurality of logic gates having a second code; and
   decoder means having a plurality of inputs to which said outputs of said first and second pluralities of logic gates are connected, and having a plurality of primary outputs, said decoder means providing signals at said primary outputs thereof representative of amplitudes of signals occurring on said system input based on logic states occurring at outputs of said first and second pluralities of logic gates, wherein at most one of said plurality of primary outputs is indefinite.

2. The apparatus of claim 1 wherein each of said first and second pluralities of logic gates is an AND logic gate.

3. The apparatus of claim 1 wherein:
   each of said reference sources is provided by a junction of a pair of resistors in a series connected plurality of resistors, said series connected plurality of resistors being adapted for electrical connection between first and second terminals of a reference voltage source.

4. The apparatus of claim 1 wherein said decoder means comprises a plurality of OR logic gates each having an output and a plurality of inputs to which selected ones of said outputs of said first and second pluralities of logic gates are electrically connected, each of said OR logic gate outputs comprising one of said plurality of outputs of said decoder means.

5. The apparatus of claim 1 wherein said signals provided on said outputs of said decoder means are digit logic signals, said digit logic signals each representing a digit in a sequence thereof to form a number.

6. The apparatus of claim 1, wherein:
   said decoder means including a plurality of complementary outputs, wherein at most one of said plurality of complementary outputs is indefinite.

7. The apparatus of claim 5, wherein:
   said digit logic signals comprises a plurality of information carrying bits, each of which is capable of representing a digit of a binary number, wherein said binary number is a Gray Code binary number.

8. The apparatus of claim 4 wherein each of said plurality of inputs of said OR logic gates is connected to at most one of said outputs of said plurality of comparators, said first plurality of logic gates, and said second plurality of logic gates.

9. A signal amplitude indicator system, as claimed in claim 1, wherein:
said first and second codes are thermometer codes.

10. A signal amplitude indicator system, as claimed in claim 1, wherein:
each of said plurality of comparators is connected to said second plurality of logic gates.

11. A parallel analog-to-digital converter, comprising:
a plurality of means for comparing a plurality of corresponding reference signals to an analog signal and generating a corresponding first plurality of signals, wherein each of said first plurality of signals indicates said analog signal is one of the following: greater than, less than, and indefinite relative to, one of said plurality of corresponding reference signals;
first means, responsive to at least some of said first plurality of signals, for generating a second plurality of signals having a first code;
second means, responsive to at least some of said first plurality of signals, for generating a third plurality of signals having a second code; and
third means for decoding said first and second codes and generating a plurality of primary digital output signals representative of said analog signal, wherein at most one of said plurality of primary digital output signals is indefinite.

12. A parallel analog-to-digital converter, as claimed in claim 11, wherein:
said first and second codes are thermometer codes.

13. A parallel analog-to-digital converter, as claimed in claim 11, wherein:
said second means includes a plurality of logic gates for generating at least a portion of said third plurality of signals, each of said plurality of logic gates having a first input connected to a first of said plurality of means for comparing and a second input connected to a second of said plurality of means for comparing separated from said first means for comparing by a third of said plurality of means for comparing, wherein each of said plurality of means for comparing being operatively connected to at least one of said plurality of logic gates.

14. A parallel analog-to-digital converter, as claimed in claim 11, wherein:
said plurality of primary digital output signals having a Gray Code.

15. A parallel analog-to-digital converter, as claimed in claim 11, wherein:
said third means for decoding generating a plurality of complementary digital output signals, wherein at most one of said plurality of complementary digital output signals is indefinite.

16. A parallel analog-to-digital converter, as claimed in claim 11, wherein:
at least one of said first and second means includes an AND gate.

17. A parallel analog-to-digital converter, comprising:
a plurality of means for comparing a plurality of corresponding reference signals to an analog signal and generating a corresponding first plurality of signals, wherein each of said first plurality of signals indicates said analog signal is one of the following: greater than, less than, and indefinite relative to, one of said plurality of corresponding reference signals;
first means, responsive to at least some of said first plurality of signals, for generating a second plurality of signals having a first code;
second means, responsive to at least some of said first plurality of signals, for generating a third plurality of signals having a second code;
means for decoding said first and second codes and generating a plurality of digital output signals having a Gray Code and representative of said analog signal, wherein at most one of said plurality of digital output signals is indefinite.

18. A parallel analog-to-digital converter, as claimed in claim 17, wherein:
said first and second codes are thermometer codes 19. A parallel analog-to-digital converter, as claimed in claim 17, wherein:
said second means includes a plurality of logic gates for generating at least a portion of said third plurality of signals, each of said plurality of logic gates having a first input connected to a first of said plurality of means for comparing and a second input connected to a second of said plurality of means for comparing separated from said first means for comparing by a third of said plurality of means for comparing, wherein each of said plurality of means for comparing, wherein each of said plurality of means for comparing being operatively connected to at least one of said plurality of logic gates.

20. A parallel analog-to-digital converter, as claimed in claim 17, wherein:
said third means for decoding also generating a plurality of complementary digital output signals, wherein at most one of said plurality of complementary digital output signals is indefinite.

21. A parallel analog-to-digital converter, comprising:
a plurality of means for comparing a plurality of corresponding reference signals to an analog signal and generating a corresponding first plurality of signals, wherein each of said first plurality of signals indicates said analog signal is one of the following: greater than, less than, and indefinite relative to, one of said plurality of reference signals;
first means, responsive to said first plurality of signals, for generating a second plurality of signals; and
second means, responsive to said second plurality of signals, for generating a plurality of primary digital output signals representative of said analog signal, wherein at most one of said plurality of primary digital output signals is indefinite.

22. A parallel analog-to-digital converter, as claimed in claim 21, wherein:
said first means includes third means for generating a first portion of said second plurality of signals and a fourth means for generating a second portion of said second plurality of signals, said first portion having a first code and said second portion having a thermometer code.

23. A parallel analog-to-digital converter, as claimed in claim 21, wherein:
said first means includes third means for generating a first portion of said second plurality of signals and fourth means for generating a second portion of said second plurality of signals code, said first portion having a first thermometer code and said second portion having a second thermometer code.

24. A parallel analog-to-digital converter, as claimed in claim 21, wherein:
said first means includes a plurality of logic gates for generating at least a portion of said second plurality of signals, each of said plurality of logic gates having a first input connected to a first of said plurality of means for comparing and a second input connected to a second of said plurality of means for comparing separated from said first means for comparing by a third of said plurality of means for comparing, wherein each of said plurality of means for comparing being operatively connected to at least one of said plurality of logic gates.

25. A parallel analog-to-digital converter, as claimed in claim 21, wherein:
said plurality of primary digital output signals having a Gray code.

26. A parallel analog-to-digital converter, as claimed in claim 21, wherein:
said second means for decoding generating a plurality of complementary digital output signals, wherein at most one of said plurality of complementary digital output signals is indefinite.

27. A parallel analog-to-digital converter, comprising:
a plurality of means for comparing a plurality of corresponding reference signals to an analog signal and generating a corresponding first plurality of signals, wherein each of said first plurality of signals indicates said analog signal is one of the following: greater than, less than, and indefinite relative to, one of said plurality of reference signals;
first means, responsive to said first plurality of signals, for generating a second plurality of signals; and
second means, responsive to said second plurality of signals, for generating a plurality of primary digital output signals having a Gray code and representative of said analog signal, wherein at most one of said primary digital output signals is indefinite.

28. A parallel analog-to-digital converter, as claimed in claim 27, wherein:
said first means includes third means for generating a first portion of said plurality of signals and a fourth means for generating a second portion of said second plurality of signals, said first portion having a first code and said second portion having a thermometer code.

29. A parallel analog-to-digital converter, as claimed in claim 27, wherein:
said first means includes third means for generating a first portion of said second plurality of signals and fourth means for generating a second portion of said second plurality of signals code, said first portion having a first thermometer code and said second portion having a second thermometer code.

30. A parallel analog-to-digital converter, as claimed in claim 27, wherein:
said first means includes a plurality of logic gates for generating at least a portion of said second plurality of signals, each of said plurality of logic gates having a first input connected to a first of said plurality of means for comparing and a second input connected to a second of said plurality of means for comparing separated from said first means for comparing by a third of said plurality of means for comparing, wherein each of said plurality of means for comparing being operatively connected to at least one of said plurality of logic gates.

31. A parallel analog-to-digital converter, as claimed in claim 27, wherein:
said second means for decoding generating a plurality of complementary output signals, wherein at most one of said plurality of complementary digital output signals is indefinite.

* * * * *